US009058859B2

(12) United States Patent
Kang

(10) Patent No.: US 9,058,859 B2
(45) Date of Patent: Jun. 16, 2015

(54) DATA OUTPUT CIRCUIT

(75) Inventor: Tae Jin Kang, Yongin-si (KR)

(73) Assignee: SK Hynix Inc., Gyeonggi-do (KR)

( * ) Notice: Subject to any disclaimer, the term of this patent is extended or adjusted under 35 U.S.C. 154(b) by 501 days.

(21) Appl. No.: 13/617,637

(22) Filed: Sep. 14, 2012

(65) Prior Publication Data

US 2013/0176797 A1    Jul. 11, 2013

(30) Foreign Application Priority Data

Jan. 5, 2012    (KR) .................... 10-2012-0001715

(51) Int. Cl.
*G11C 7/00* (2006.01)
*G11C 7/10* (2006.01)
*G11C 7/22* (2006.01)

(52) U.S. Cl.
CPC ............ *G11C 7/1057* (2013.01); *G11C 7/1066* (2013.01); *G11C 7/222* (2013.01)

(58) Field of Classification Search
USPC ................................ 365/189.17, 201, 189.05
See application file for complete search history.

(56) References Cited

U.S. PATENT DOCUMENTS 7,994,833 B2 *    8/2011    Shin .............................. 327/158
2009/0116314 A1    5/2009    Byun

FOREIGN PATENT DOCUMENTS

KR    10-0499405 B1    6/2005

* cited by examiner

*Primary Examiner* — Vu Le
(74) *Attorney, Agent, or Firm* — William Park & Associates Ltd.

(57) ABSTRACT

A data output circuit includes a control signal generation block configured to generate a first transfer control signal which is produced in a first read operation and a second transfer control signal which is produced in a second read operation, where the first transfer control signal and the second transfer control signal are generated upon entry into a test mode; and an enable signal generation unit configured to generate first and second enable signals for generating first and second internal clocks, in response to the first and second transfer control signals.

33 Claims, 15 Drawing Sheets

DATA OUTPUT CIRCUIT

CROSS-REFERENCES TO RELATED APPLICATIONS

The present application claims priority under 35 U.S.C 119(a) to Korean Patent Application No. 10-2012-0001715 filed on Jan. 5, 2012 in the Korean Intellectual Property Office, which is incorporated herein by reference in its entirety as set forth in full.

BACKGROUND

Semiconductor memory devices have been continuously improved in terms of operating speeds and the degree of integration. In order to improve the operating speed, a synchronous memory device capable of operating in synchronization with a clock applied from outside the memory chip has been introduced in the art.

An SDR (single data rate) synchronous memory device inputs and outputs one data in one data pin in synchronization with the rising edge of a clock for one cycle of a clock applied from outside the memory device.

However, the SDR synchronous memory device is insufficient to satisfy the speed of a system requiring a high speed operation, and under this situation, a DDR (double data rate) synchronous memory device for processing two data for one cycle of a clock has been proposed.

In each data input/output pin of the DDR synchronous memory device, two data are consecutively inputted and outputted in synchronization with the rising edge and the falling edge of a clock inputted from an outside source. Therefore, because a band width at least two times wider than the SDR synchronous memory device may be realized without increasing the frequency of a clock, a high operation speed may be realized.

As the frequency of a clock increases for a high speed operation, it is important to secure a data valid window for testing data outputted from a semiconductor memory device.

FIG. 1 is a timing diagram for data outputted in synchronization with an internal clock in a conventional data output circuit.

Describing, with reference to FIG. 1, the data outputted in synchronization with an internal clock in the conventional data output circuit, a rising clock RCLK of the internal clock is generated by buffering a preliminary rising clock RCLKP generated in synchronization with the rising edge of an external clock CLK in an enable period of a first enable signal FOUTEN. A falling clock FCLK of the internal clock is generated by buffering a preliminary falling clock FCLKP generated in synchronization with the falling edge of the external clock CLK in the enable period of a second enable signal ROUTEN. That is to say, the rising clock RCLK and the falling clock FCLK are generated in synchronization with the rising edge and the falling edge of the external clock CLK in the periods in which the first and second enable signals FOUTEN and ROUTEN are enabled. Data are sequentially outputted through a DQ pad DQ in synchronization with the rising clock RCLK and the falling clock FCLK.

A first bit 0 of the data sequentially outputted through the DQ pad DQ is outputted to the DQ pad DQ during a period A with a time corresponding to one half cycle (0.5tCLK) of the external clock CLK. A second bit 1 of the data is outputted to the DQ pad DQ during a period B with a time corresponding to one half cycle (0.5tCLK) of the external clock CLK. That is to say, the bits of the data are sequentially outputted through the DQ pad DQ each bit for one half cycle (0.5tCLK) of the external clock CLK.

However, since a time for testing the levels of the data bits outputted to the DQ pad DQ should correspond to one half cycle (0.5tCLK) of the external clock CLK as in the period A and the period B, a valid window for testing the levels of the data bits is shortened as the external clock CLK is inputted with a high frequency, and thus, it is difficult to stably perform a data test.

SUMMARY

An embodiment of the present invention relates to a data output circuit in which internal clocks are separately generated at different times to output rising data and falling data at different times, thereby being capable of securing a data valid window and stably performing a data test.

In one embodiment, a data output circuit includes: a control signal generation block configured to generate a first transfer control signal which is produced in a first read operation and a second transfer control signal which is produced in a second read operation, where the first transfer control signal and the second transfer control signal are generated upon entry into a test mode; and an enable signal generation unit configured to generate first and second enable signals for generating first and second internal clocks, in response to the first and second transfer control signals.

In another embodiment, a data output circuit includes: a control signal generation unit configured to generate a transfer control signal which is produced in a read operation upon entry into a test mode; and an enable signal generation unit configured to generate an enable signal for generating an internal clock, in response to the transfer control signal.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
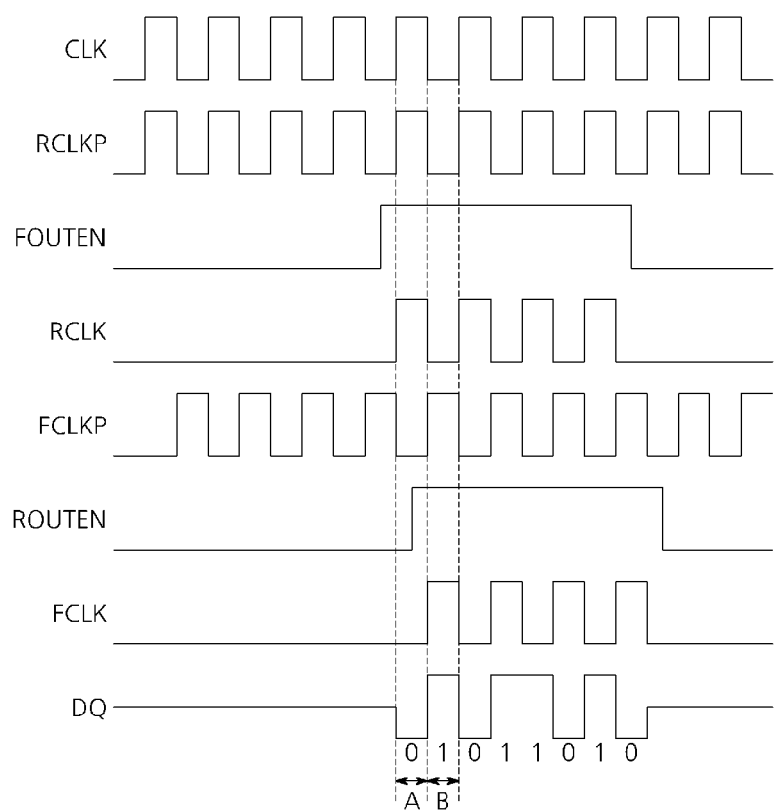
FIG. 1 is a timing diagram of data outputted in synchronization with an internal clock in a conventional data output circuit.
Figure 2:
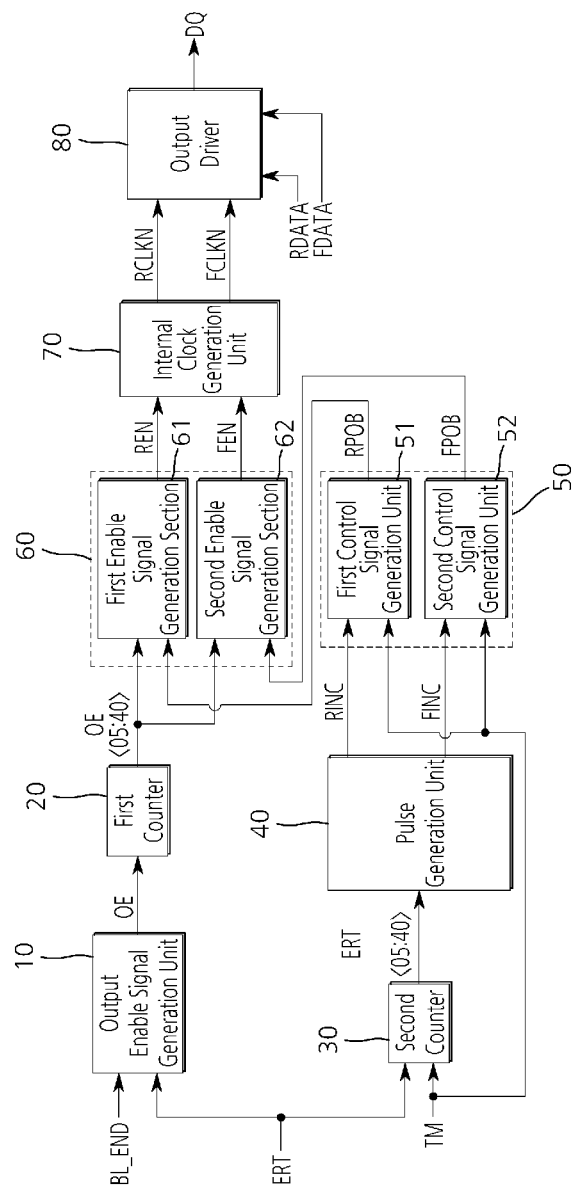
FIG. 2 is a block diagram showing the configuration of a data output circuit in accordance with an embodiment of the present invention.

FIG. 2 is a block diagram showing a configuration of a data output circuit in accordance with an embodiment of the present invention.

Referring to FIG. 2, a data output circuit in accordance with an embodiment of the present invention includes an output enable signal generation unit 10, a first counter 20, a second counter 30, a pulse generation unit 40, a control signal generation block 50, an enable signal generation unit 60, an internal clock generation unit 70, an output driver 80. The output enable signal generation unit 10 may be configured to generate an output enable signal OE which is enabled at a time when a read operation signal ERT is enabled upon entry into a read operation and is disabled at a time when a burst length end signal BL_END is enabled. The first counter 20 may be configured to shift the output enable signal OE and generate first to eighth output shifting signals OE<05:40>. The second counter 30 may be configured to shift the read operation signal ERT and generate first to eighth read shifting signals ERT<05:40>. The pulse generation unit 40 may be configured to generate first and second pulse signals RINC and FINC which are produced in the read operation. The control signal generation block 50 may be configured to generate, upon entry into a test mode, a first transfer control signal RPOB which is produced in a second read operation and a second transfer control signal FPOB which is produced in a first read operation. The enable signal generation unit 60 may be configured to be inputted with the first and second transfer control signals RPOB and FPOB and generate first and second enable signals REN and FEN for generating first and second internal clocks RCLKN and FCLKN. The internal clock generation unit 70 may be configured to generate the second internal clock FCLKN at a time when the first enable signal REN is enabled and generate the first internal clock RCLKN at a time when the second enable signal FEN is enabled. The output driver 80 may be configured to output rising data RDATA to a DQ pad DQ during a period in which the first internal clock RCLKN is generated and output falling data FDATA to the DQ pad DQ during a period in which the second internal clock FCLKN is generated.

A configuration of the output enable signal generation unit 10 will be described below in detail with reference to FIG. 3.

Figure 3:
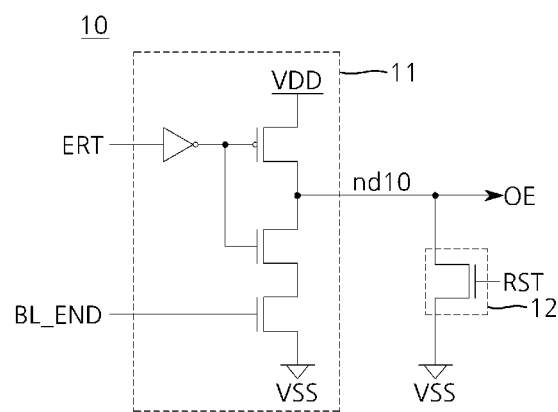
FIG. 3 is a circuit diagram of an output enable signal generation unit included in the data output circuit shown in FIG. 2.

Referring to FIG. 3, the output enable signal generation unit 10 includes a driving section 11 configured to be inputted with the read operation signal ERT and the burst length end signal BL_END, drive a node nd10 and generate the output enable signal OE. The output enable signal generation unit 10 may also include an initializing section 12 configured to be inputted with a reset signal RST which is enabled during a power-up period in which the level of a power supply voltage VDD is reached as a target level, pull-down drive the node nd10 and initialize the output enable signal OE.

The driving section 11 is inputted with the read operation signal ERT which is enabled to a logic high level for a predetermined period upon entry into the read operation, pull-up drives the node nd10, and enables the output enable signal OE. Also, the driving section 11 is inputted with the burst length end signal BL_END which is enabled to a logic high level when the read operation signal ERT is disabled to a logic low level and a burst length ends, and disables the output enable signal OE to a logic low level. That is to say, the driving section 11 of the output enable signal generation unit 10 generates the output enable signal OE which is enabled at a read operation starting time and is disabled at a burst length end time. Further, the driving section 11 may drive the node nd10 in response to the read operation signal ERT and the burst length end signal BL_END.

The initializing section 12 is inputted with the reset signal RST which is enabled to a logic high level in the power-up period, pull-down drives the node nd10 in response to the reset signal RST, and disables the output enable signal OE to the logic low level.

The configuration of the first counter 20 will be described below in detail with reference to FIG. 4.

Figure 4:
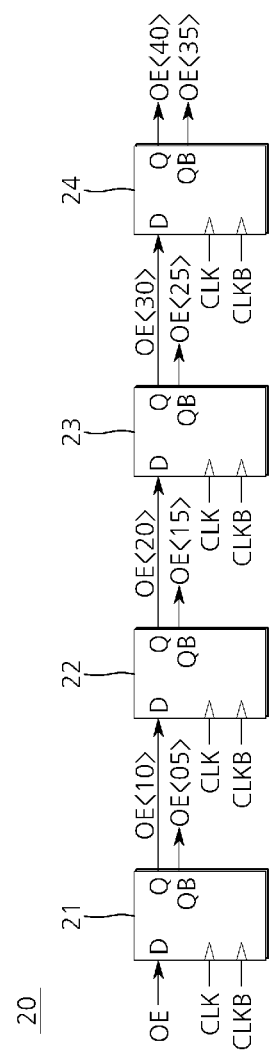
FIG. 4 is a block diagram showing a configuration of a first counter included in the data output circuit shown in FIG. 2.

Referring to FIG. 4, the first counter 20 includes a first register 21, a second register 22, a third register 23, and a fourth register 24. The first register 21 may be configured to be inputted with an external clock CLK and an inverted external clock CLKB, delay the output enable signal OE by one half cycle of the external clock CLK and generate a first output shifting signal OE<05>, and delay the output enable signal OE by one cycle of the external clock CLK and generate a second output shifting signal OE<10>. The second register 22 may be configured to be inputted with the external clock CLK and the inverted external clock CLKB, delay the second output shifting signal OE<10> by one half cycle of the external clock CLK and generate a third output shifting signal OE<15>, and delay the second output shifting signal OE<10> by one cycle of the external clock CLK and generate a fourth output shifting signal OE<20>. The third register 23 may be configured to be inputted with the external clock CLK and the inverted external clock CLKB, delay the fourth output shifting signal OE<20> by one half cycle of the external clock CLK and generate a fifth output shifting signal OE<25>, and delay the fourth output shifting signal OE<20> by one cycle of the external clock CLK and generate a sixth output shifting signal OE<30>. The fourth register 24 may be configured to be inputted with the external clock CLK and the inverted external clock CLKB, delay the sixth output shifting signal OE<30> by one half cycle of the external clock CLK and generate a seventh output shifting signal OE<35>, and delay the sixth output shifting signal OE<30> by one cycle of the external clock CLK and generate an eighth output shifting signal OE<40>. The first to fourth registers 21 to 24 may be realized by flip-flops each of which delays an input signal D by one half cycle of the external clock CLK and generates an output signal QB, and delays the input signal D by one cycle of the external clock CLK and generates an output signal Q.

Figure 5:
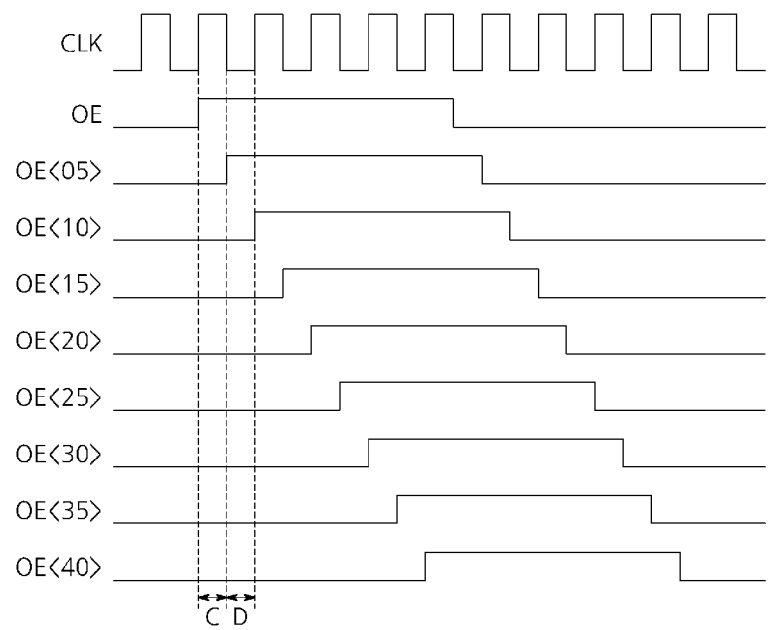
FIG. 5 is a timing diagram showing input and output signals of the first counter shown in FIG. 4.

FIG. 5 is a timing diagram showing input and output signals of the first counter shown in FIG. 4.

Referring to FIG. 5, the first output shifting signal OE<05> is generated by being delayed by a period C, where period C has a delay time of one half cycle (0.5tCLK) of the external clock CLK and the first output shifting signal OE<05> is delayed from the output enable signal OE. The second output shifting signal OE<10> is generated by being delayed by a period D, where period D is a delay time of one half cycle (0.5tCLK) of the external clock CLK, and the second output shifting signal is delayed from the first output shifting signal OE<05>. Since the third to eighth output shifting signals OE<15:40> are generated with the same delay time as the first and second output shifting signals OE<05:10>, detailed descriptions thereof will be omitted herein. That is to say, the first to eighth output shifting signals OE<05:40> generated by the first counter 20 are generated by being sequentially delayed by one half cycle (0.5tCLK) of the external clock CLK from the output enable signal OE.

A configuration of the second counter 30 will be described below in detail with reference to FIG. 6.

Figure 6:
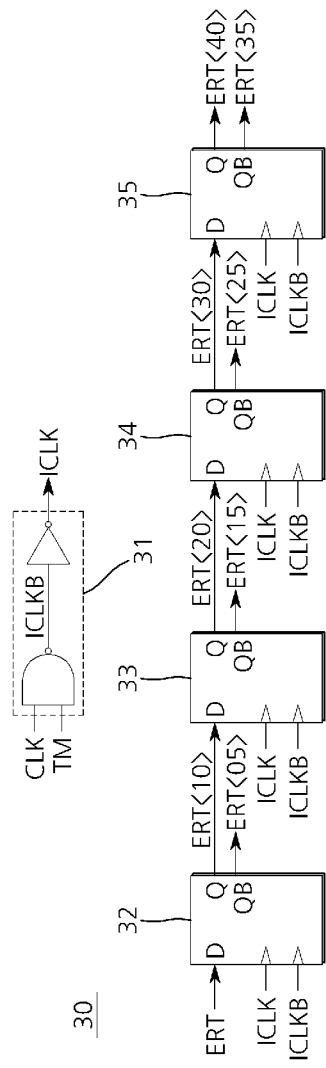
FIG. 6 is a diagram showing a configuration of a second counter included in the data output circuit shown in FIG. 2.

Referring to FIG. 6, the second counter 30 includes a first logic section 31, a fifth register 32, a sixth register 33, a seventh register 34, and an eight register 35. The first logic section 31 may be configured to be inputted with the external clock CLK and a test mode signal TM, perform a logic operation and generate a control clock ICLK and an inverted control clock ICLKB. The fifth register 32 may be configured to be inputted with the control clock ICLK and the inverted control clock ICLKB, delay the read operation signal ERT by one half cycle of the control clock ICLK and generate a first read shifting signal ERT<05>, and delay the read operation signal ERT by one cycle of the control clock ICLK and generate a second read shifting signal ERT<10>. The sixth register 33 may be configured to be inputted with the control clock ICLK and the inverted control clock ICLKB, delay the second read shifting signal ERT<10> by one half cycle of the control clock ICLK and generate a third read shifting signal ERT<15>, and delay the second read shifting signal ERT<10> by one cycle of the control clock ICLK and generate a fourth read shifting signal ERT<20>. The seventh register 34 may be configured to be inputted with the control clock ICLK and the inverted control clock ICLKB, delay the fourth read shifting signal ERT<20> by one half cycle of the control clock ICLK and generate a fifth read shifting signal ERT<25>, and delay the fourth read shifting signal ERT<20> by one cycle of the control clock ICLK and generate a sixth read shifting signal ERT<30>. The eighth register 35 may be configured to be inputted with the control clock ICLK and the inverted control clock ICLKB, delay the sixth read shifting signal ERT<30> by one half cycle of the control clock ICLK and generate a seventh read shifting signal ERT<35>, and delay the sixth read shifting signal ERT<30> by one cycle of the control clock ICLK and generate an eighth read shifting signal ERT<40>. The fifth to eighth registers 32 to 35 may be realized by flip-flops each of which delays an input signal D by one half cycle of the control clock ICLK and generates an output signal QB, and delays the input signal D by one cycle of the control clock ICLK and generates an output signal Q.

The configuration of the pulse generation unit 40 will be described below in detail with reference to FIG. 7.

Figure 7:
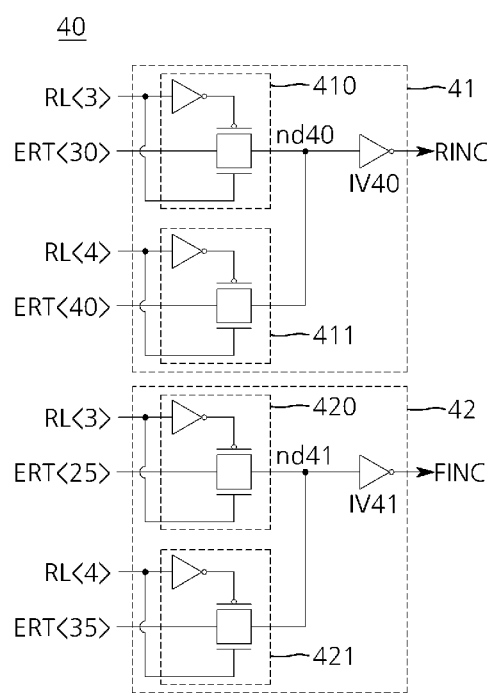
FIG. 7 is a circuit diagram showing a configuration of a pulse generation unit included in the data output circuit shown in FIG. 2.

Referring to FIG. 7, the pulse generation unit 40 includes a first pulse generating section 41 configured to generate at least one of the sixth and eighth read shifting signals ERT<30:40> as a first pulse signal RINC in response to first and second read latency signals RL<3:4> which are selectively enabled, and a second pulse generating section 42 configured to generate at least any one of the fifth and seventh read shifting signals ERT<25:35> as a second pulse signal FINC in response to the first and second read latency signals RL<3:4>. In detail, the first pulse generating section 41 includes a first transfer part 410 configured to transfer the sixth read shifting signal ERT<30> to a node nd40 when the first read latency signal RL<3> is enabled, a second transfer part 411 configured to transfer the eighth read shifting signal ERT<40> to the node nd40 when the second read latency signal RL<4> is enabled, and a first buffer IV40 configured to buffer the signal of the node nd40 and generate the first pulse signal RINC. The second pulse generating section 42 includes a third transfer part 420 configured to transfer the fifth read shifting signal ERT<25> to a node nd41 when the first read latency signal RL<3> is enabled, a fourth transfer part 421 configured to transfer the seventh read shifting signal ERT<35> to the node nd41 when the second read latency signal RL<4> is enabled, and a second buffer IV41 configured to buffer the signal of the node nd41 and generate the second pulse signal FINC. The first and second read latency signals RL<3:4> are signals which are set in a mode register set (MRS) to set data output times upon entry into the read operation.

Figure 8:
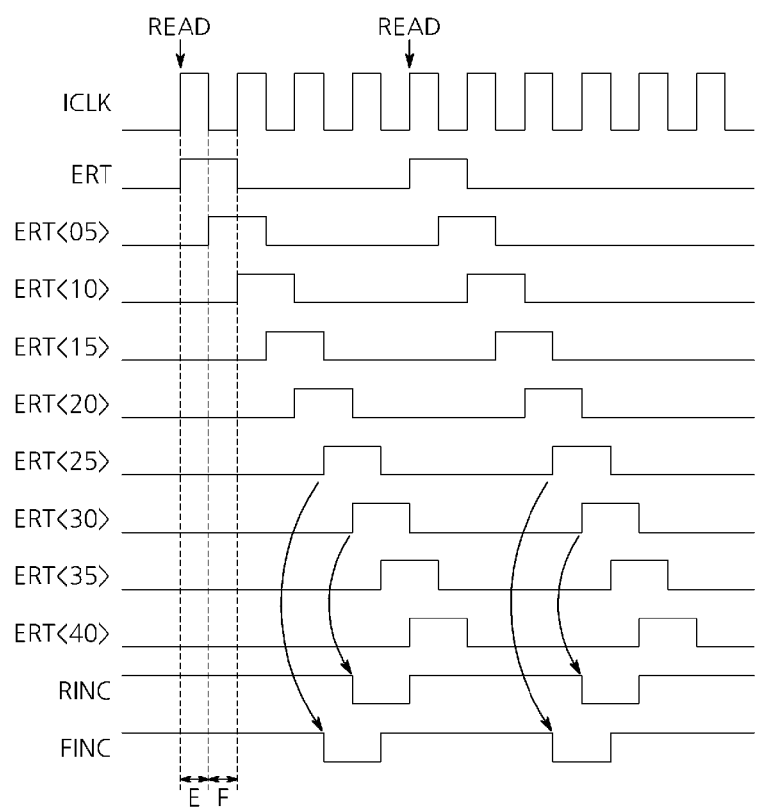
FIG. 8 is a timing diagram showing input and output signals of the second counter and the pulse generation unit.

FIG. 8 is a timing diagram showing the input and output signals of the second counter 30 and the pulse generation unit 40.

Referring to FIG. 8, the first read shifting signal ERT<05> is generated by being delayed by a period E, where period E has a delay time of one half cycle (0.5tICLK) of the control clock ICLK, and the first read shifting signal ERT<05> is delayed from the read operation signal ERT which is enabled upon entry into the read operation READ. The second read shifting signal ERT<10> is generated by being delayed by a period F, where period D has a delay time of one half cycle (0.5tICLK) of the control clock ICLK from the first read shifting signal ERT<05>. Since the third to eighth read shifting signals ERT<15:40> are generated with the same delay time as the first and second read shifting signals ERT<05:10>, detailed descriptions thereof will be omitted herein. That is to say, the first to eighth read shifting signals ERT<05:40> generated by the second counter 30 are generated by being sequentially delayed by one half cycle (0.5tICLK) of the control clock ICLK from the read operation signal ERT. If the first read latency signal RL<3> is generated to a logic high level in the mode register set (MRS), the first pulse signal RINC generated by the pulse generation unit 40 is generated by inversion-buffering the sixth read shifting signal ERT<30>, and the second pulse signal FINC is generated by inversion-buffering the fifth read shifting signal ERT<25>.

Configuration of the control signal generation block 50 will be described below in detail with reference to FIGS. 9 and 10.

The control signal generation block 50 may include a first control signal generation unit 51 and a second control signal generation unit 52. The first control signal generation unit 51 may be configured to be inputted with the first pulse signal RINC after the power-up period and generate the first transfer control signal RPOB which is enabled in response to the first pulse signal RINC which is generated in the second read operation after a power-up period. The second control signal generation unit 52 may be configured to be inputted with the second pulse signal FINC after the power-up period and generate the second transfer control signal FPOB which is enabled in the first read operation in response to the second pulse signal FINC which is generated in the read operation after the power-up period.

Figure 9:
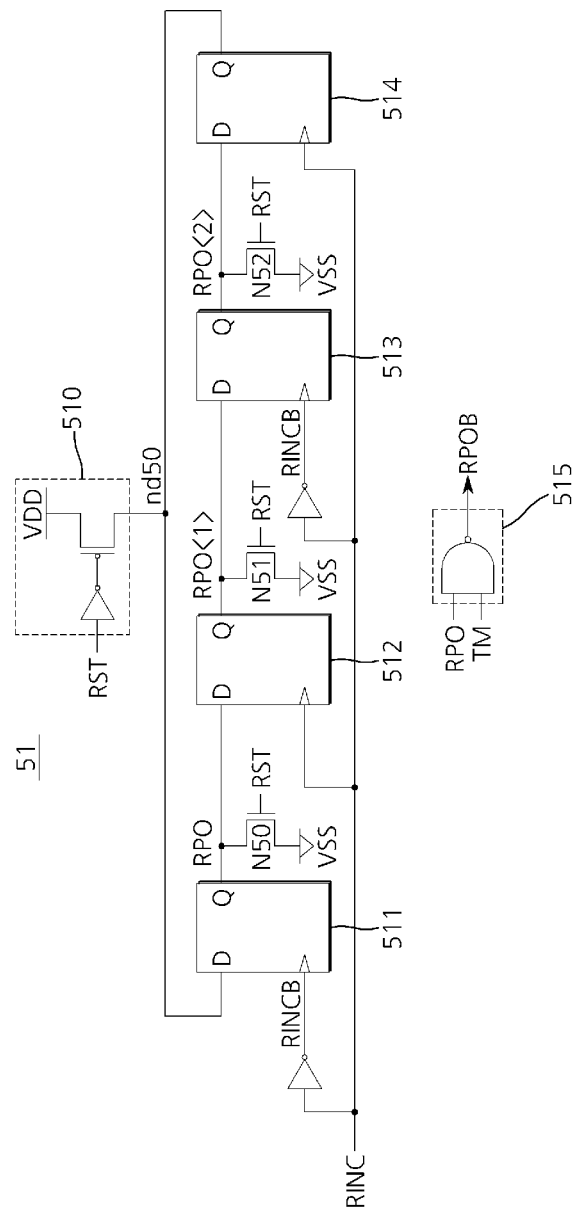
FIG. 9 is a diagram showing a configuration of a first control signal generation unit included in the data output circuit shown in FIG. 2.

Referring to FIG. 9, the first control signal generation unit 51 includes a first reset section 510, a first flip-flop 511, a second flip-flop 512, a third flip-flop 513, a fourth flip-flop 514 and a second logic section 515. The first reset section 510 may be configured to be inputted with the reset signal RST which is enabled to the logic high level in the power-up period and pull-up drive a node nd50. The first flip-flop 511 may be configured to be inputted with a first inverted pulse signal RINCB and transfer the signal of the node nd50 as a first transfer signal RPO. The second flip-flop 512 may be configured to be inputted with the first pulse signal RINC and transfer the first transfer signal RPO as a second transfer signal RPO<1>. The third flip-flop 513 may be configured to be inputted with the first inverted pulse signal RINCB and transfer the second transfer signal RPO<1> as a third transfer signal RPO<2>. The fourth flip-flop 514 may be configured to be inputted with the first pulse signal RINC and output the third transfer signal RPO<2> to the node nd50. The second logic section 515 may be configured to NAND the first transfer signal RPO and the test mode signal TM and generate the first transfer control signal RPOB. The first inverted pulse signal RINCB is a signal which is acquired by inversion-buffering the first pulse signal RINC. The first control signal generation unit 51 further includes transistors N50 to N52 which are turned on by being inputted with the reset signal RST enabled to the logic high level in the power-up period and initialize the first to third transfer signals RPO, RPO<1> and RPO<2> to logic low levels. The first to third transfer signals RPO, RPO<1> and RPO<2> may be disabled in the power-up period.

Figure 10:
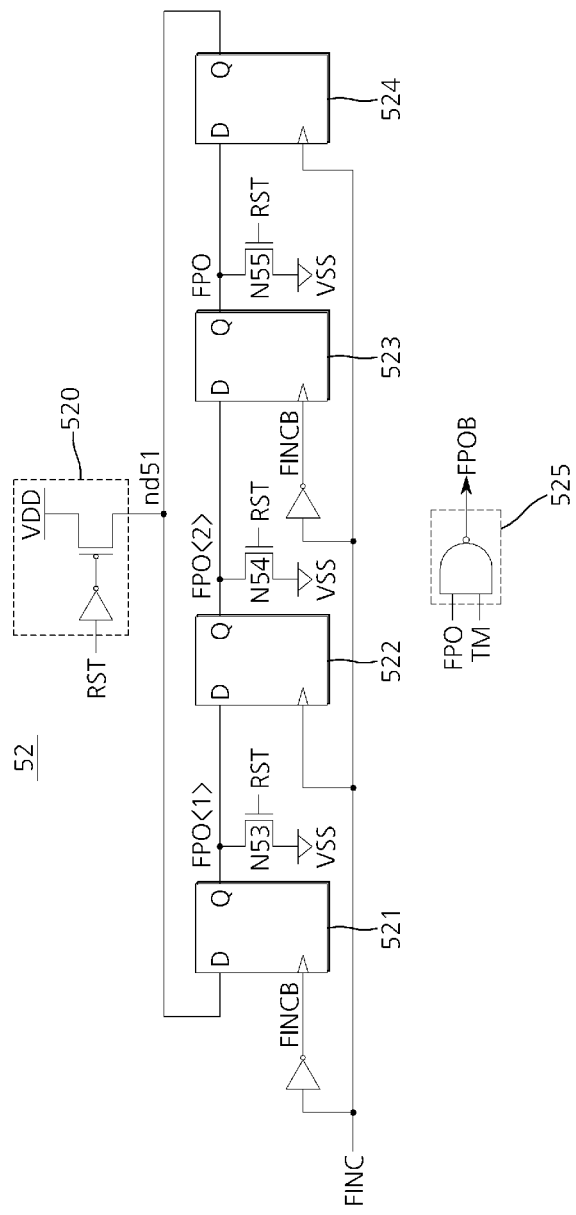
FIG. 10 is a diagram showing a configuration of a second control signal generation unit included in the data output circuit shown in FIG. 2.

Referring to FIG. 10, the second control signal generation unit 52 includes a second reset section 520, a fifth flip-flop 521, a sixth flip-flop 522, a seventh flip-flop 523, an eighth flip-flop 524, and a third logic section 525. The second reset section 520 may be configured to be inputted with the reset signal RST which is enabled to the logic high level in the power-up period and pull-up drive a node nd51 in response to the reset signal. The fifth flip-flop 521 may be configured to be inputted with a second inverted pulse signal FINCB and transfer the signal of the node nd51 as a fourth transfer signal FPO<1> in response to the second inverted pulse signal FINCB. The sixth flip-flop 522 may be configured to be inputted with the second pulse signal FINC and transfer the fourth transfer signal FPO<1> as a fifth transfer signal FPO<2> in response to the second pulse signal FINC. The seventh flip-flop 523 may be configured to be inputted with the second inverted pulse signal FINCB and transfer the fifth transfer signal FPO<2> as a sixth transfer signal FPO in response to the second inverted pulse signal FINCB. The eighth flip-flop 524 may be configured to be inputted with the second pulse signal FINC and output the sixth transfer signal FPO to the node nd51 in response to the second pulse signal FINC. The third logic section 525 may be configured to NAND the sixth transfer signal FPO and the test mode signal TM and generate the second transfer control signal FPOB. The second inverted pulse signal FINCB is a signal which is acquired by inversion-buffering the second pulse signal FINC. The second control signal generation unit 52 further includes transistors N53 to N55 which are turned on by being inputted with the reset signal RST enabled to the logic high level in the power-up period and initialize the fourth to sixth transfer signals FPO<1>, FPO<2> and FPO to logic low levels. The fourth to sixth transfer signals FPO<1>, FPO<2> and FPO may be disabled in the power-up period.

Figure 11:
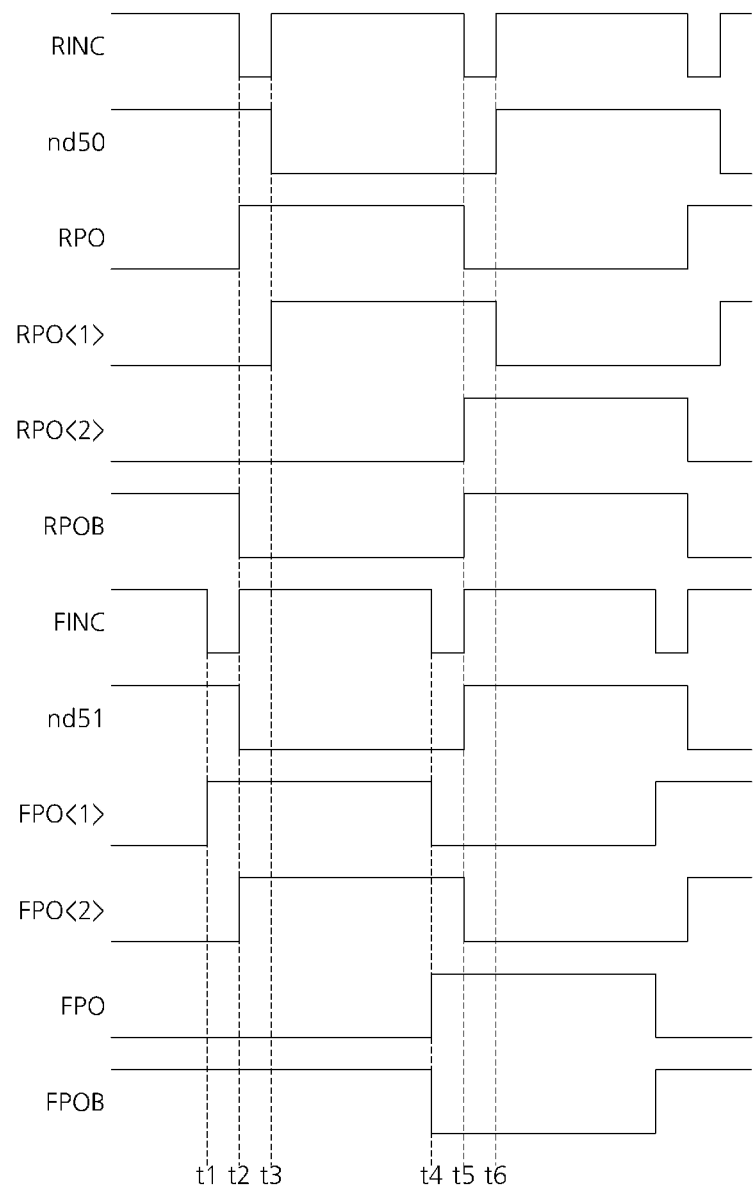
FIG. 11 is a timing diagram explaining operations of the first and second control signal generation units which generate first and second transfer control signals.

In the control signal generation block 50, enable times of the first transfer control signal RPOB, which is generated in the second read operation, and the second transfer control signal FPOB, which is generated in the first read operation, will be described below with reference to FIG. 11, by dividing the enable time of the first transfer control signal RPOB and the enable time of the second transfer control signal FPOB.

The enable time of the first transfer control signal RPOB will be described below with reference to FIG. 11.

First, the first reset section 510 of the first control signal generation unit 51 is inputted with the reset signal RST which is enabled to the logic high level in the power-up period and initializes the signal of the node nd50 to a logic high level, and the transistors N50 to N52 are turned on by being inputted with the reset signal RST which is enabled to the logic high level in the power-up period and initialize the first to third transfer signals RPO, RPO<1> and RPO<2> to the logic low levels.

The first flip-flop 511 transfers the signal of the node nd50 with the logic high level as the first transfer signal RPO at a time t2 where the first pulse signal RINC is enabled to a logic low level upon entry into the first read operation. The third flip-flop 513 transfers the second transfer signal RPO<1> of the logic low level as the third transfer signal RPO<2>. The second flip-flop 512 transfers the first transfer signal RPO of a logic high level as the second transfer signal RPO<1> at a time t3 where the first pulse signal RINC is disabled to a logic high level. The fourth flip-flop 514 transfers the third transfer signal RPO<2> of the logic low level to the node nd50. At this time, the second logic section 515 NANDs the test mode signal TM of a logic high level and the first transfer signal RPO having the logic high level after the time t2, and the second logic section 515 generates the first transfer control signal RPOB with a logic low level.

The first flip-flop 511 transfers the signal of the node nd50 with a logic low level as the first transfer signal RPO at a time t5 where the first pulse signal RINC is enabled to the logic low level upon entry into the second read operation, and the third flip-flop 513 transfers the second transfer signal RPO<1> of a logic high level as the third transfer signal RPO<2>. The second flip-flop 512 transfers the first transfer signal RPO with the logic low level as the second transfer signal RPO<1> at a time t6 where the first pulse signal RINC is disabled to the logic high level, and the fourth flip-flop 514 transfers the third transfer signal RPO<2> with a logic high level to the node nd50. The second logic section 515 NANDs the test mode signal TM of the logic high level and the first transfer signal RPO having the logic low level after the time t5, and the second logic section 515 generates the first transfer control signal RPOB with a logic high level. Namely, the first control signal generation unit 51 generates the first transfer control signal RPOB which is enabled to the logic high level in the second read operation.

The enable time of the second transfer control signal FPOB will be described below with reference to FIG. 11.

The second reset section 520 of the second control signal generation unit 52 is inputted with the reset signal RST which is enabled to the logic high level in the power-up period and initializes the signal of the node nd51 to a logic high level. The transistors N53 to N55 are turned on by being inputted with the reset signal RST which is enabled to the logic high level in the power-up period and initialize the fourth to sixth transfer signals FPO<1>, FPO<2> and FPO to the logic low levels.

Next, the fifth flip-flop 521 transfers the signal of the node nd51 with the logic high level as the fourth transfer signal FPO<1> at a time t1 where the second pulse signal FINC is enabled to a logic low level upon entry into the first read operation. The seventh flip-flop 523 transfers the fifth transfer signal FPO<2> of the logic low level as the sixth transfer signal FPO. The sixth flip-flop 522 transfers the fourth transfer signal FPO<1> of a logic high level as the fifth transfer signal FPO<2> at a time t2 where the second pulse signal FINC is disabled to a logic high level. The eighth flip-flop 524 transfers the sixth transfer signal FPO with the logic low level to the node nd51. The third logic section 525 NANDs the test mode signal TM having the logic high level after the time t1.

The sixth transfer signal FPO of the logic low level, and generates the second transfer control signal FPOB with a logic high level.

The fifth flip-flop 521 transfers the signal of the node nd51 with a logic low level as the fourth transfer signal FPO<1> at a time t4 where the second pulse signal FINC is enabled to the logic low level upon entry into the second read operation. The seventh flip-flop 523 transfers the fifth transfer signal FPO<2> having a logic high level as the sixth transfer signal FPO. The sixth flip-flop 522 transfers the fourth transfer signal FPO<1> having the logic low level as the fifth transfer signal FPO<2> at a time t5 where the second pulse signal FINC is disabled to the logic high level. The eighth flip-flop 524 transfers the sixth transfer signal FPO having a logic high level to the node nd51. The third logic section 525 NANDs the test mode signal TM of the logic high level and the sixth transfer signal FPO having the logic high level after the time t4, and the third logic section 525 generates the second transfer control signal FPOB with a logic low level. Namely, the second control signal generation unit 52 generates the second transfer control signal FPOB which is enabled to the logic high level in the first read operation.

As a consequence, the control signal generation block 50 enables the second transfer control signal FPOB in the first read operation and enables the first transfer control signal RPOB in the second read operation.

A configuration of the enable signal generation unit 60 will be described below in detail with reference to FIG. 12.

Figure 12:
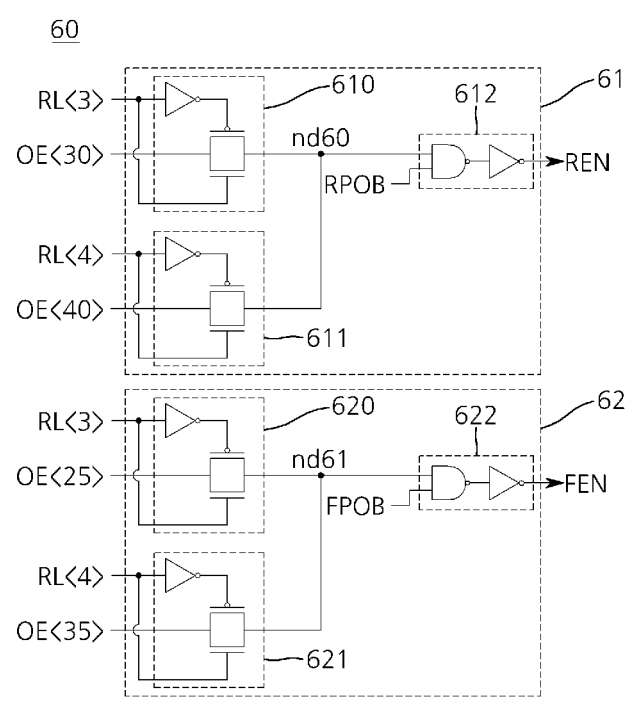
FIG. 12 is a circuit diagram showing a configuration of the enable signal generation unit included in the data output circuit shown in FIG. 2.

Referring to FIG. 12, the enable signal generation unit 60 includes a first enable signal generating section 61 and a second enable signal generating section 61. The first enable signal generating section 61 may be configured to generate the first enable signal REN which is enabled when the first transfer control signal RPOB is enabled upon entry into the test mode and transfer at least any one of the sixth output shifting signal OE<30> and the eighth output shifting signal OE<40> as the first enable signal REN according to the first and second read latency signals RL<3:4> upon exit from the test mode. The second enable signal generating section 62 may be configured to generate the second enable signal FEN which is enabled when the second transfer control signal FPOB is enabled upon entry into the test mode and transfer at least any one of the fifth output shifting signal OE<25> and the seventh output shifting signal OE<35> as the second enable signal FEN in response to the first and second read latency signals RL<3:4> upon exit from the test mode.

In detail, the first enable signal generating section 61 includes a fifth transfer part 610 configured to transfer the sixth output shifting signal OE<30> to a node nd60 when the first read latency signal RL<3> is inputted, a sixth transfer part 611 configured to transfer the eighth output shifting signal OE<40> to the node nd60 when the second read latency signal RL<4> is inputted, and a fourth logic section 612 configured to AND the signal of the node nd60 and the first transfer control signal RPOB and generate the first enable signal REN. The second enable signal generating section 62 includes a seventh transfer part 620 configured to transfer the fifth output shifting signal OE<25> to a node nd61 when the first read latency signal RL<3> is inputted, an eighth transfer part 621 configured to transfer the seventh output shifting signal OE<35> to the node nd61 when the second read latency signal RL<4> is inputted, and a fifth logic section 622 configured to AND the signal of the node nd61 and the second transfer control signal FPOB and generate the second enable signal FEN.

A configuration of the internal clock generation unit 70 will be described below in detail with reference to FIG. 13.

Figure 13:
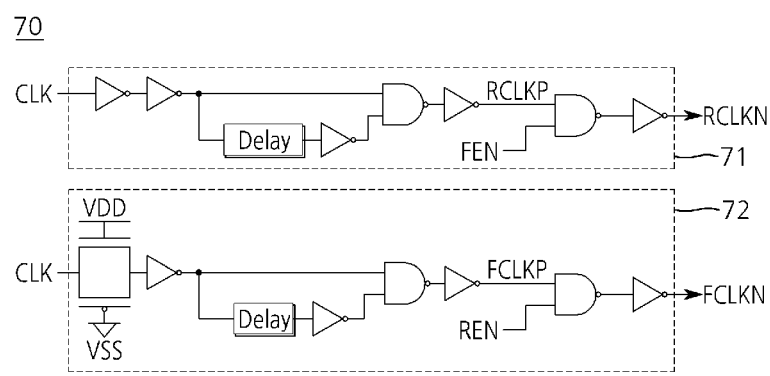
FIG. 13 is a circuit diagram showing a configuration of an internal clock generation unit included in the data output circuit shown in FIG. 2.

Referring to FIG. 13, the internal clock generation unit 70 includes a first internal clock generating section 71 and a second internal clock 72. The first internal clock generating section 71 may be configured to generate the first internal clock RCLKN in response to the second enable signal, where the first internal clock RCLKN is synchronized with the rising edge of the external clock CLK during a period in which the second enable signal FEN is enabled. The second internal clock generating section 72 may be configured to generate the second internal clock FCLKN in response to the first enable signal, where the second internal clock FCLKN is synchronized with the falling edge of the external clock CLK during a period in which the first enable signal REN is enabled.

The configuration of the output driver 80 will be described below in detail with reference to FIG. 14.

Figure 14:
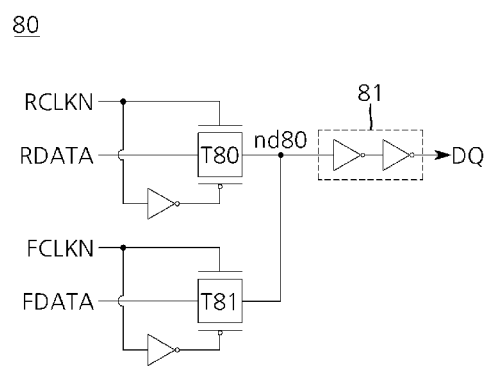
FIG. 14 is a circuit diagram showing a configuration of an output driver included in the data output circuit shown in FIG. 2.

Referring to FIG. 14, the output driver 80 includes a first transfer gate T80 configured to transfer the rising data RDATA to a node nd80 during the period in which the first internal clock RCLKN is inputted, a second transfer gate T81 configured to transfer the falling data FDATA to the node nd80 during the period in which the second internal clock FCLKN is inputted, and a delay section 81 configured to buffer the signal of the node nd80 and output a resultant signal to the DQ pad DQ.

Figure 15:
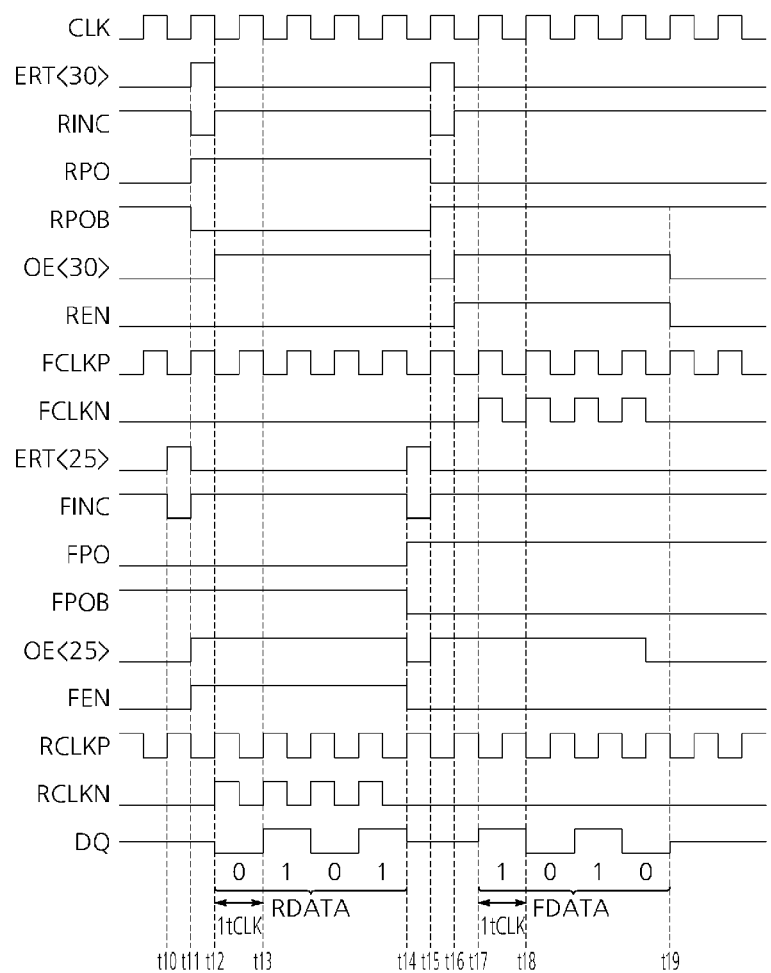
FIG. 15 is a timing diagram explaining operations of the data output circuit in accordance with an embodiment of the present invention.

Operations of the data output circuit configured as mentioned above will be described with reference to FIG. 15, in which, upon entry into the test mode, the first read operation and the second read operation are performed in such a manner that the output period of the data bits outputted to the DQ pad is maintained for one cycle of the external clock CLK.

In the first read operation, the first logic section 31 of the second counter 30 ANDS the test mode signal TM which is enabled to the logic high level upon entry into the test mode and the external clock CLK, and generates the control clock ICLK and the inverted control clock ICLKB. The fifth register 32 delays the read operation signal ERT which is enabled in the first read operation, by one half cycle of the control clock ICLK, and the fifth register 32 generates the first read shifting signal ERT<05>, and the fifth register 32 delays the read operation signal ERT by one cycle of the control clock ICLK and the fifth register 32 generates the second read shifting signal ERT<10>. The sixth register 33 delays the second read shifting signal ERT<10> by one half cycle of the control clock ICLK and the sixth register 33 generates the third read shifting signal ERT<15>, and the sixth register 33 delays the second read shifting signal ERT<10> by one cycle of the control clock ICLK and the sixth register 33 generates the fourth read shifting signal ERT<20>. The seventh register 34 delays the fourth read shifting signal ERT<20> by one half cycle of the control clock ICLK and the seventh register 34 generates the fifth read shifting signal ERT<25>, and the seventh register 34 delays the fourth read shifting signal ERT<20> by one cycle of the control clock ICLK and the seventh register 34 generates the sixth read shifting signal ERT<30>. The eighth register 35 delays the sixth read shifting signal ERT<30> by one half cycle of the control clock ICLK and the eighth register 35 generates the seventh read shifting signal ERT<35>, and the eighth register 35 delays the sixth read shifting signal ERT<30> by one cycle of the control clock ICLK and the eighth register 35 generates the eighth read shifting signal ERT<40>. The second counter 30 generates the first to eighth read shifting signals ERT<05:40> in the second read operation in the same way as in the first read operation.

The first transfer part 410 of the first pulse generating section 41 is inputted with the first read latency signal RL<3> which is generated to the logic high level in the mode register set (MRS) in the first read operation, and transfers the sixth read shifting signal ERT<30> to the node nd40. Because the second latency signal RL<4> is generated having a logic low level, the second transfer part 411 does not transfer the eighth read shifting signal ERT<40> to the node nd40. The first buffer IV40 buffers the signal of the node nd40 and outputs the first pulse signal RINC. The first pulse generating section 41 generates the first pulse signal RINC in the second read operation in a substantially similar way as in the first read operation. That is to say, the first pulse signal RINC is enabled to the logic low level during the period from t11 to t12 in the first read operation, and is enabled to the logic low level during the period from t15 to t16 in the second read operation.

The third transfer part 420 of the second pulse generating section 42 is inputted with the first read latency signal RL<3> which is generated to the logic high level in the mode register set (MRS) in the first read operation, and transfers the fifth read shifting signal ERT<25> to the node nd41. Because the second latency signal RL<4> is generated to the logic low level, the fourth transfer part 421 does not transfer the seventh read shifting signal ERT<35> to the node nd41. The second buffer IV41 buffers the signal of the node nd41 and outputs the second pulse signal FINC. The second pulse generating section 42 generates the second pulse signal FINC in the second read operation in the same way as in the first read operation. That is to say, the second pulse signal FINC is enabled to the logic low level during the period from t10 to t11 in the first read operation, and the second pulse signal FINC is enabled to the logic low level during the period from t14 to t15 in the second read operation.

The first flip-flop 511 of the first control signal generation unit 51 transfers the signal of the node nd50 with the logic high level as the first transfer signal RPO at the time t11 where the first pulse signal RINC is enabled to the logic low level upon entry into the first read operation. The third flip-flop 513 transfers the second transfer signal RPO<1> having the logic low level as the third transfer signal RPO<2>. The second flip-flop 512 transfers the first transfer signal RPO having the logic high level as the second transfer signal RPO<1> at the time t12 where the first pulse signal RINC is disabled to the logic high level. The fourth flip-flop 514 transfers the third transfer signal RPO<2> having the logic low level to the node nd50. Further, upon entry into the second read operation, the first flip-flop 511 transfers the signal of the node nd50 of the logic low level as the first transfer signal RPO at the time t15 where the first pulse signal RINC is enabled to the logic low level. At this time, the second logic section 515 NANDs the test mode signal TM of the logic high level and the first transfer signal RPO having the logic high level during a period from t11 to t15, and the second logic section 515 generates the first transfer control signal RPOB of the logic low level during the period from t11 to t15. In other words, the second logic section 515 generates the first transfer control signal RPOB which is disabled to the logic low level upon entry into the first read operation.

The fifth flip-flop 521 of the second control signal generation unit 52 transfers the signal of the node nd51 with the logic high level as the fourth transfer signal FPO<1> at the time t10 where the second pulse signal FINC is enabled to the logic low level upon entry into the first read operation, and the seventh flip-flop 523 transfers the fifth transfer signal FPO<2> of the logic low level as the sixth transfer signal FPO. The sixth flip-flop 522 transfers the fourth transfer signal FPO<1> with the logic high level as the fifth transfer signal FPO<2> at the time t11 where the second pulse signal FINC is disabled to the logic high level, and the eighth flip-flop 524 transfers the sixth transfer signal FPO with the logic low level to the node nd51. Further, upon entry into the second read operation, the seventh flip-flop 523 transfers the fifth transfer signal FPO<2> having the logic high level as the sixth transfer signal FPO at the time t14 where the second pulse signal FINC is enabled to the logic low level. The third logic section 525 NANDs the test mode signal TM having the logic high level and the sixth transfer signal FPO having the logic low level during a period from t11 to t14, and the third logic section 525 generates the second transfer control signal FPOB having the logic high level during the period from t11 to t14. In other words, the third logic section 525 generates the second transfer control signal FPOB which is enabled to the logic high level upon entry into the first read operation.

In succession, the first flip-flop 511 of the first control signal generation unit 51 transfers the signal of the node nd50 with the logic low level as the first transfer signal RPO at the time t15 where the first pulse signal RINC is enabled to the logic low level upon entry into the second read operation, and the third flip-flop 513 transfers the second transfer signal RPO<1> of the logic high level as the third transfer signal RPO<2>. The second flip-flop 512 transfers the first transfer signal RPO of the logic low level as the second transfer signal RPO<1> at the time t16 where the first pulse signal RINC is disabled to the logic high level, and the fourth flip-flop 514 transfers the third transfer signal RPO<2> of the logic high level to the node nd50. The second logic section 515 NANDs the test mode signal TM of the logic high level and the first transfer signal RPO having the logic low level at the time t15, and generates the first transfer control signal RPOB of the logic high level at the time t15. Namely, the second logic section 515 generates the first transfer control signal RPOB which is enabled to the logic high level in the second read operation.

The fifth flip-flop 521 of the second control signal generation unit 52 transfers the signal of the node nd51 with the logic low level as the fourth transfer signal FPO<1> at the time t14 where the second pulse signal FINC is enabled to the logic low level upon entry into the second read operation. The seventh flip-flop 523 transfers the fifth transfer signal FPO<2> of the logic high level as the sixth transfer signal FPO. The sixth flip-flop 522 transfers the fourth transfer signal FPO<1> of the logic low level as the fifth transfer signal FPO<2> at the time t15 where the second pulse signal FINC is disabled to the logic high level, and the eighth flip-flop 524 transfers the sixth transfer signal FPO having the logic high level to the node nd51. At this time, the third logic section 525 NANDs the test mode signal TM of the logic high level and the sixth transfer signal FPO having the logic high level at the time t14, and generates the second transfer control signal FPOB of the logic low level at the time t14. That is to say, the third logic section 525 generates the second transfer control signal FPOB which is disabled to the logic low level in the second read operation.

The first enable signal generating section 61 ANDS the first transfer control signal RPOB and the sixth output shifting signal OE<30> where the first transfer control signal RPOB is generated with the logic high level from the time t15 in the second read operation and the sixth output shifting signal OE<30> is generated with the logic high level during a period from t16 to t19. The first enable signal generating section 61 generates the first enable signal REN with a logic high level during the period from t16 to t19. The second enable signal generating section 62 ANDs the second transfer control signal FPOB and the fifth output shifting signal OE<25>, where the second transfer control signal FPOB is generated with the logic high level during the period from t11 to t14 in the first read operation and the fifth output shifting signal OE<25> is generated with the logic high level during the period from t11 to t14. The second enable signal generating section 62 also generates the second enable signal FEN to a logic high level during the period from t11 to t14.

The first internal clock generating section 71 buffers the first preliminary clock RCLKP which is generated in synchronization with the falling edge of the external clock CLK during the period from t11 to t14 in which the second enable signal FEN is enabled in the first read operation, and the first internal clock generating section 71 generates the first internal clock RCLKN. The second internal clock generating section 72 buffers the second preliminary clock FCLKP which is generated in synchronization with the rising edge of the external clock CLK during the period from t16 to t19 in which the first enable signal REN is enabled in the second read operation, and the second internal clock generating section 72 generates the second internal clock FCLKN.

The output driver 80 outputs the first bit 0 of the rising data RDATA, which is synchronized with the rising edge of the first internal clock RCLKN, to the DQ pad DQ in a period from t12 to t13 corresponding to one cycle (1tCLK) of the external clock CLK, and the bits of the rising data RDATA are sequentially outputted to the DQ pad DQ each in one cycle (1tCLK) of the external clock CLK. Further, the output driver 80 outputs the first bit 1 of the falling data FDATA, which is synchronized with the rising edge of the second internal clock FCLKN, to the DQ pad DQ in a period from t17 to t18 corresponding to one cycle (1tCLK) of the external clock CLK, and the bits of the falling data FDATA are sequentially outputted to the DQ pad DQ each in one cycle (1tCLK) of the external clock CLK. That is to say, the output driver 80 sequentially outputs the bits of the rising data RDATA to the DQ pad DQ each in one cycle (1tCLK) of the external clock CLK in the first read operation, and sequentially outputs the bits of the falling data FDATA to the DQ pad DQ each in one cycle (1tCLK) of the external clock CLK in the second read operation.

As is apparent from the above descriptions, in the data output circuit in accordance with an embodiment of the present invention, a first internal clock is generated in a first read operation, and a second internal clock is generated in a second read operation. Also, in the first read operation, the bits of rising data are sequentially outputted to a DQ pad each in one cycle (1tCLK) of an external clock, and in the second read operation, the bits of falling data are sequentially outputted to the DQ pad each in one cycle (1tCLK) of the external clock. Accordingly, since a data valid window for testing data bits may be secured as one cycle (1tCLK) of the external clock, a data test may be stably performed.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A data output circuit comprising:
a control signal generation block configured to generate a first transfer control signal which is produced in a first read operation and a second transfer control signal which is produced in a second read operation, where the first transfer control signal and the second transfer control signal are generated upon entry into a test mode; and
an enable signal generation unit configured to generate first and second enable signals for generating first and second internal clocks, in response to the first and second transfer control signals.

2. The data output circuit according to claim 1, wherein the control signal generation block comprises:
a first control signal generation unit configured to generate the first transfer control signal which is enabled in response to a first pulse signal which is generated in a read operation after a power-up period; and
a second control signal generation unit configured to generate the second transfer control signal which is enabled in response to a second pulse signal which is generated in the read operation after the power-up period.

3. The data output circuit according to claim 2, wherein the first control signal generation unit comprises:
a first reset section configured to pull-up drive a first node in response to a reset signal which is enabled in the power-up period;
a first flip-flop configured to transfer a signal of the first node as a first transfer signal in response to a first inverted pulse signal;
a second flip-flop configured to transfer the first transfer signal as a second transfer signal in response to the first pulse signal;
a third flip-flop configured to transfer the second transfer signal as a third transfer signal in response to the first inverted pulse signal;
a fourth flip-flop configured to transfer the third transfer signal to the first node in response to the first pulse signal; and
a first logic section configured to perform a logic operation on the first transfer signal and a test mode signal and generate the first transfer control signal.

4. The data output circuit according to claim 3, wherein the first, second, and third transfer signals are signals which are disabled in the power-up period.

5. The data output circuit according to claim 2, wherein the second control signal generation unit comprises:
a second reset section configured to pull-up drive a second node in response to the reset signal which is enabled in the power-up period;
a fifth flip-flop configured to transfer a signal of the second node as a fourth transfer signal in response to a second inverted pulse signal;
a sixth flip-flop configured to transfer the fourth transfer signal as a fifth transfer signal in response to the second pulse signal;
a seventh flip-flop configured to transfer the fifth transfer signal as a sixth transfer signal in response to the second inverted pulse signal;
an eighth flip-flop configured to transfer the sixth transfer signal to the second node in response to the second pulse signal; and
a second logic section configured to perform a logic operation on the sixth transfer signal and the test mode signal and generate the second transfer control signal.

6. The data output circuit according to claim 5, wherein the fourth, fifth, and sixth transfer signals are signals which are disabled in the power-up period.

7. The data output circuit according to claim 1, further comprising:
an output enable signal generation unit configured to generate an output enable signal which is enabled in response to a read operation signal which is enabled upon entry into the read operation and is disabled in response to a burst length end signal which is enabled at a burst length end time; and
a first counter configured to shift the output enable signal in response to an external clock and generate output shifting signals.

8. The data output circuit according to claim 7, wherein the output enable signal generation unit comprises:
- a driving section configured to drive a third node in response to the read operation signal and the burst length end signal, and generate the output enable signal; and
- an initializing section configured to pull-down drive the third node in response to the reset signal which is enabled in the power-up period, and initialize the output enable signal.

9. The data output circuit according to claim 7, wherein the first counter comprises:
- a first register configured to delay the output enable signal by one half cycle of the external clock and generate a first output shifting signal, and delay the output enable signal by one cycle of the external clock and generate a second output shifting signal, in response to the external clock; and
- a second register configured to delay the second output shifting signal by one half cycle of the external clock and generate a third output shifting signal, and delay the second output shifting signal by one cycle of the external clock and generate a fourth output shifting signal, in response to the external clock.

10. The data output circuit according to claim 9, wherein the enable signal generation unit comprises:
- a first enable signal generating section configured to generate the first enable signal which is enabled when the first transfer control signal is enabled upon entry into the test mode, and transfer at least any one of the second and fourth output shifting signals as the first enable signal in response to a read latency signal upon exit from the test mode; and
- a second enable signal generating section configured to generate the second enable signal which is enabled when the second transfer control signal is enabled upon entry into the test mode, and transfer at least any one of the first and third output shifting signals as the second enable signal in response to the read latency signal upon exit from the test mode.

11. The data output circuit according to claim 10, wherein the first enable signal generating section comprises:
- a first transfer part configured to transfer the second output shifting signal to a fourth node in response to a first read latency signal;
- a second transfer part configured to transfer the fourth output shifting signal to the fourth node in response to a second read latency signal; and
- a third logic section configured to buffer a signal of the fourth node in response to the first transfer control signal and generate the first enable signal.

12. The data output circuit according to claim 11, wherein the second enable signal generating section comprises:
- a third transfer part configured to transfer the first output shifting signal to a fifth node in response to the first read latency signal;
- a fourth transfer part configured to transfer the third output shifting signal to the fifth node in response to the second read latency signal; and
- a fourth logic section configured to buffer a signal of the fifth node in response to the second transfer control signal and generate the second enable signal.

13. The data output circuit according to claim 7, further comprising:
- a second counter configured to shift the read operation signal which is enabled in the first and second read operations, in response to the test mode signal, and generate read shifting signals;
- a pulse generation unit configured to buffer the read shifting signals in response to a read latency signal and generate the first and second pulse signals;
- an internal clock generation unit configured to buffer the external clock in response to the first and second enable signals and generate the first and second internal clocks; and
- an output driver configured to buffer rising data in response to the first internal clock and sequentially output the rising data through a DQ pad, and buffer falling data in response to the second internal clock and sequentially output the falling data through the DQ pad.

14. The data output circuit according to claim 13, wherein the second counter comprises:
- a fifth logic section configured to perform a logic operation on the external clock and the test mode signal and generate a control clock and an inverted control clock;
- a third register configured to delay the read operation signal by one half cycle of the control clock and generate a first read shifting signal, and delay the read operation signal by one cycle of the control clock and generate a second read shifting signal, in response to the control clock and the inverted control clock; and
- a fourth register configured to delay the second read shifting signal by one half cycle of the control clock and generate a third read shifting signal, and delay the second read shifting signal by one cycle of the control clock and generate a fourth read shifting signal, in response to the control clock and the inverted control clock.

15. The data output circuit according to claim 14, wherein the pulse generation unit comprises:
- a first pulse generating section configured to generate at least any one of the second and fourth read shifting signals as the first pulse signal in response to the read latency signal; and
- a second pulse generating section configured to generate at least any one of the first and third read shifting signals as the second pulse signal in response to the read latency signal.

16. The data output circuit according to claim 15, wherein the first pulse generating section comprises:
- a fifth transfer part configured to transfer the second read shifting signal to a sixth node in response to the first read latency signal;
- a sixth transfer part configured to transfer the fourth read shifting signal to the sixth node in response to the second read latency signal; and
- a first buffer configured to buffer a signal of the sixth node and generate the first pulse signal.

17. The data output circuit according to claim 16, wherein the second pulse generating section comprises:
- a seventh transfer part configured to transfer the first read shifting signal to a seventh node in response to the first read latency signal;
- an eighth transfer part configured to transfer the third read shifting signal to the seventh node in response to the second read latency signal; and
- a second buffer configured to buffer a signal of the seventh node and generate the second pulse signal.

18. The data output circuit according to claim 13, wherein the internal clock generation unit comprises:
- a first internal clock generating section configured to generate the first internal clock which is synchronized with a rising edge of the external clock, in response to the second enable signal; and
- a second internal clock generating section configured to generate the second internal clock which is synchronized with a falling edge of the external clock, in response to the first enable signal.

19. A data output circuit comprising:
a control signal generation unit configured to generate a transfer control signal which is produced in a read operation upon entry into a test mode; and
an enable signal generation unit configured to generate an enable signal for generating an internal clock, in response to the transfer control signal.

20. The data output circuit according to claim 19, wherein the transfer control signal is a signal which is enabled in response to a pulse signal which is generated in the read operation after a power-up period.

21. The data output circuit according to claim 19, wherein the control signal generation unit comprises:
a first reset section configured to pull-up drive a first node in response to a reset signal which is enabled in the power-up period;
a first flip-flop configured to transfer a signal of the first node as a first transfer signal in response to an inverted pulse signal;
a second flip-flop configured to transfer the first transfer signal as a second transfer signal in response to the pulse signal;
a third flip-flop configured to transfer the second transfer signal as a third transfer signal in response to the inverted pulse signal;
a fourth flip-flop configured to transfer the third transfer signal to the first node in response to the pulse signal; and
a first logic section configured to perform a logic operation on the first transfer signal and a test mode signal and generate the transfer control signal.

22. The data output circuit according to claim 21, wherein the first, second, and third transfer signals are signals which are disabled in the power-up period.

23. The data output circuit according to claim 19, further comprising:
an output enable signal generation unit configured to generate an output enable signal which is enabled in response to a read operation signal which is enabled upon entry into the read operation and is disabled in response to a burst length end signal which is enabled at a burst length end time; and
a first counter configured to shift the output enable signal in response to an external clock and generate output shifting signals.

24. The data output circuit according to claim 23, wherein the output enable signal generation unit comprises:
a driving section configured to drive a second node in response to the read operation signal and the burst length end signal, and generate the output enable signal; and
an initializing section configured to pull-down drive the second node in response to the reset signal which is enabled in the power-up period, and initialize the output enable signal.

25. The data output circuit according to claim 23, wherein the first counter comprises:
a first register configured to delay the output enable signal by one half cycle of the external clock and generate a first output shifting signal, and delay the output enable signal by one cycle of the external clock and generate a second output shifting signal, in response to the external clock; and
a second register configured to delay the second output shifting signal by one half cycle of the external clock and generate a third output shifting signal, and delay the second output shifting signal by one cycle of the external clock and generate a fourth output shifting signal, in response to the external clock.

26. The data output circuit according to claim 25, wherein the enable signal is a signal which is enabled when the transfer control signal is enabled upon entry into the test mode.

27. The data output circuit according to claim 26, wherein the enable signal is a signal which is acquired as at least any one of the second and fourth output shifting signals is transferred in response to a read latency signal upon exit from the test mode.

28. The data output circuit according to claim 25, wherein the enable signal generation unit comprises:
a first transfer part configured to transfer the second output shifting signal to a third node in response to a first read latency signal;
a second transfer part configured to transfer the fourth output shifting signal to the third node in response to a second read latency signal; and
a second logic section configured to buffer a signal of the third node in response to the transfer control signal and generate the enable signal.

29. The data output circuit according to claim 23, further comprising:
a second counter configured to shift the read operation signal in response to the test mode signal and generate read shifting signals;
a pulse generation unit configured to buffer the read shifting signals in response to a read latency signal and generate the pulse signal;
an internal clock generation unit configured to buffer the external clock in response to the enable signal and generate the internal clock; and
an output driver configured to buffer rising data in response to the internal clock and sequentially output the rising data through a DQ pad.

30. The data output circuit according to claim 29, wherein the second counter comprises:
a third logic section configured to perform a logic operation on the external clock and the test mode signal and generate a control clock and an inverted control clock;
a third register configured to delay the read operation signal by one half cycle of the control clock and generate a first read shifting signal, and delay the read operation signal by one cycle of the control clock and generate a second read shifting signal, in response to the control clock and the inverted control clock; and
a fourth register configured to delay the second read shifting signal by one half cycle of the control clock and generate a third read shifting signal, and delay the second read shifting signal by one cycle of the control clock and generate a fourth read shifting signal, in response to the control clock and the inverted control clock.

31. The data output circuit according to claim 30, wherein the pulse signal is a signal which is acquired as at least any one of the second and fourth read shifting signals is transferred in response to the read latency signal.

32. The data output circuit according to claim 31, wherein the pulse generating unit comprises:
a third transfer part configured to transfer the second read shifting signal to a fourth node in response to the first read latency signal;
a fourth transfer part configured to transfer the fourth read shifting signal to the fourth node in response to the second read latency signal; and
a first buffer configured to buffer a signal of the fourth node and generate the pulse signal.

33. The data output circuit according to claim 29, wherein the internal clock is generated in synchronization with a rising edge of the external clock during an enable period of the enable signal.

* * * * *